(12) United States Patent
Gabrielsson

(10) Patent No.: US 12,169,226 B2
(45) Date of Patent: Dec. 17, 2024

(54) DIGITAL RESIDUAL CURRENT DETECTING SYSTEM

(71) Applicant: Webasto Charging Systems, Inc., Monrovia, CA (US)

(72) Inventor: Peter Gabrielsson, Monrovia, CA (US)

(*) Notice: Subject to any disclaimer, the term of this patent is extended or adjusted under 35 U.S.C. 154(b) by 103 days.

(21) Appl. No.: 17/901,502

(22) Filed: Sep. 1, 2022

(65) Prior Publication Data

US 2024/0077547 A1 Mar. 7, 2024

(51) Int. Cl.
*G01R 31/52* (2020.01)
*G01R 19/25* (2006.01)

(52) U.S. Cl.
CPC ......... *G01R 31/52* (2020.01); *G01R 19/2509* (2013.01)

(58) Field of Classification Search
CPC .. G01R 31/52; G01R 19/2509; H02H 1/0007; H02H 3/33
See application file for complete search history.

(56) References Cited

U.S. PATENT DOCUMENTS

| | | | | |
|---|---|---|---|---|
| 2013/0194101 A1* | 8/2013 | Devupalli | ............... | G01R 31/58 290/31 |
| 2015/0123671 A1* | 5/2015 | Yannam | ................ | G01R 31/52 324/511 |
| 2015/0192631 A1* | 7/2015 | Seon | ........................ | H02H 3/33 324/509 |
| 2015/0301127 A1 | 10/2015 | Suchoff et al. | | |
| 2018/0191150 A1* | 7/2018 | Chen | ...................... | H02H 3/334 |
| 2018/0224488 A1* | 8/2018 | Gabrielsson | ............ | B60L 53/00 |
| 2018/0321296 A1* | 11/2018 | Salsich | ................ | B23K 11/258 |
| 2019/0379229 A1* | 12/2019 | Woo | ......................... | H02J 7/02 |
| 2022/0123205 A1* | 4/2022 | Park | ....................... | H10B 12/01 |

FOREIGN PATENT DOCUMENTS

| | | |
|---|---|---|
| EP | 3121609 A1 | 1/2017 |
| EP | 3608678 A1 | 2/2020 |
| JP | 6610191 B2 | 11/2019 |

OTHER PUBLICATIONS

International Search Report and Written Opinion for PCT/US2023/031293 mailed Nov. 20, 2023.

* cited by examiner

*Primary Examiner* — Alvaro E Fortich
(74) *Attorney, Agent, or Firm* — Concept IP LLP; Michael Zarrabian

(57) ABSTRACT

Systems, devices, and methods including a first drive winding wound on a first core, where the first drive winding may be driven with a first input signal; a second drive winding wound on a second core, where the second drive winding may be driven with a second input signal, and where the second input signal has an opposite polarity of the first input signal; a first comparator configured to receive a first drive signal from the first drive winding; a second comparator configured to receive a second drive signal from the second drive winding; and a processor configured to receive the output signals from the first comparator and the second comparator, determine a saturation status of the first core and the second core, and determine a potential leakage signal based said saturation status of the first core and the second core.

20 Claims, 17 Drawing Sheets

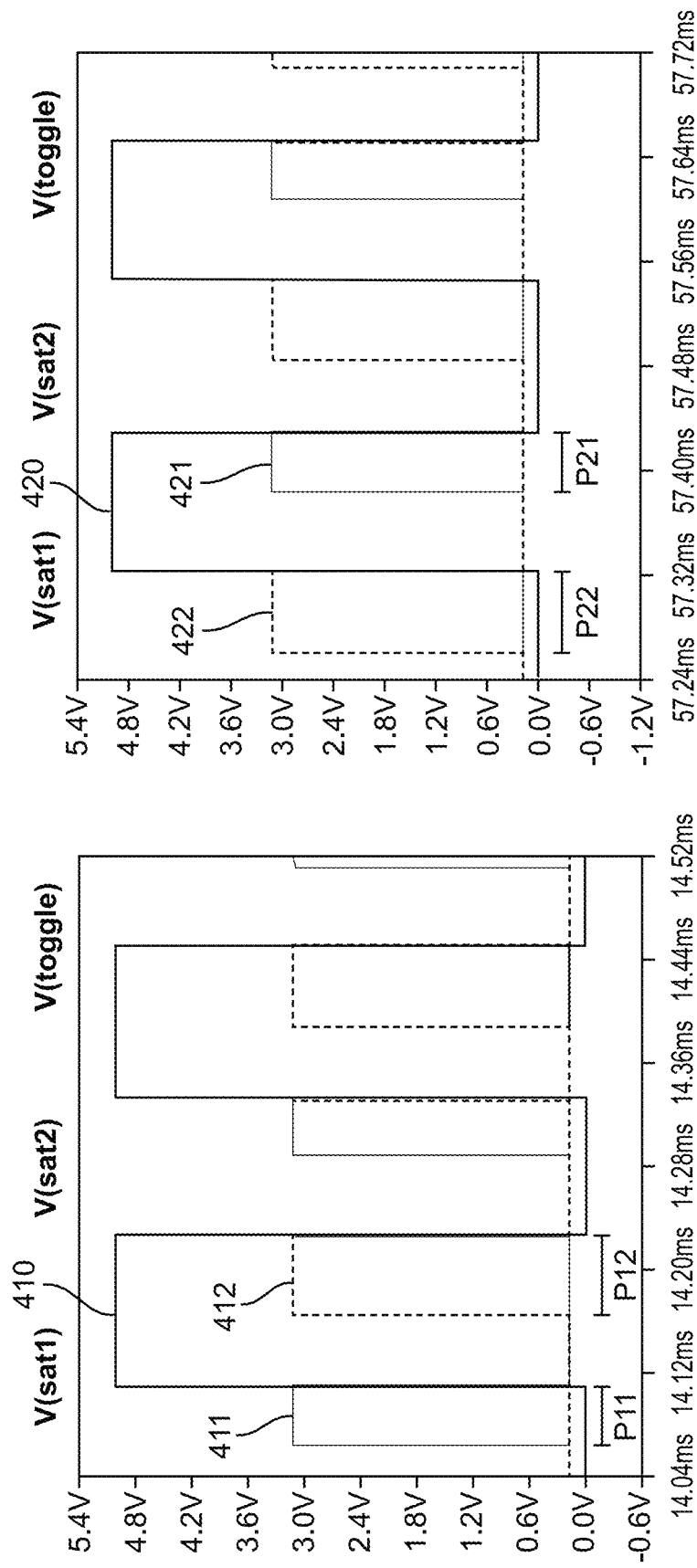

DIGITAL RESIDUAL CURRENT DETECTING SYSTEM

TECHNICAL FIELD

Embodiments relate generally to residual current detecting systems, and more particularly to a residual current detecting system with digital circuits.

BACKGROUND

Residual Current Detection (RCD) is an essential function for the safe charging of electric vehicles. The RCD is responsible for interrupting AC power should a conduction path to ground appear in the charging circuit. For example, a person touching live components of an Electric Vehicle (EV) may cause a conduction path to ground.

Conventional systems for detecting residual leakage current rely heavily on analog components. These conventional systems require magnetic cores that are substantially identical to each other in order for the systems to detect a leakage current. Furthermore, the heavy reliance on analog components makes these systems susceptible to interference from strong external electromagnetic fields.

SUMMARY

A system embodiment may include: a first drive winding wound on a first core, wherein the first drive winding is driven with a first high frequency square wave current; a second drive winding wound on a second core, wherein the second drive winding is driven with a second high frequency square wave current, and wherein the second high frequency square wave current has an opposite polarity of the first high frequency square wave current; a first comparator receiving a first drive current from the first drive winding wound; a second comparator receiving a second drive current from the second drive winding wound; and a processor configured to: receive an output from the first comparator as a first signal input and an output from the second comparator as a second signal input, determine if both the first core and the second core are saturated based on the first signal input and the second signal input, flip the polarity of the drive current to a first polarity if both the first core and the second core are determined to be saturated, record a first rising edge time and a first period for the first signal input and for the second signal input, flip the polarity of the drive current to a second polarity, record a second rising edge time and a second period for the first signal input and the second signal input, calculate an initial value based on the differences in first rising edge times and second rising edge times between the first signal input and the second signal input, and the sum of the first and second periods of the first signal input and the second signal input, and configure the initial value based on predetermined scalers and constants.

A system embodiment may include: a first drive winding wound on a first core, where the first drive winding may be driven with a first input signal; a second drive winding wound on a second core, where the second drive winding may be driven with a second input signal, and where the second input signal has an opposite polarity of the first input signal; a first comparator configured to receive a first drive signal from the first drive winding, and output a signal based on the saturation of the first core; a second comparator configured to receive a second drive signal from the second drive winding, and output a signal based on the saturation of the second core; and a processor configured to receive the output signals from the first comparator and the second comparator, determine a saturation status of the first core and the second core, and determine a potential leakage signal based said saturation status of the first core and the second core.

In additional system embodiments, the first input signal may be a high frequency voltage, and where the second input signal may be a high frequency voltage. In additional system embodiments, the first input signal may be a high frequency current, and where the second input signal may be a high frequency current. In additional system embodiments, the first comparator may be configured to receive a reference signal and compare the reference signal to the first drive signal and output the signal based on the comparison indicating the saturation of the first core, and where the second comparator may be configured to receive the reference signal and compare the reference signal to the second drive signal and output the signal based on the comparison indicating the saturation of the second core In additional system embodiments, the processor may be further configured to: flip a polarity of the first input signal and the second input signal to a first polarity if both the first core and the second core may be determined to be saturated based on the determined saturation status of the first core and the second core. In additional system embodiments, the processor may be further configured to: record a first rising edge time and a first period for the first signal input and for the second signal input. In additional system embodiments, the processor may be further configured to: flip the polarity of the first input signal and the second input to a second polarity. In additional system embodiments, the processor may be further configured to: record a second rising edge time and a second period for the first signal input and the second signal input. In additional system embodiments, the processor may be further configured to: calculate an initial value based on the differences in first rising edge times and second rising edge times between the first signal input and the second signal input, and the sum of the first and second periods of the first signal input and the second signal input, where the determined potential leakage signal may be based on the calculated initial value. In additional system embodiments, the processor may be further configured to: scale the calculated initial value; and filter the scaled initial value, where the determined potential leakage signal may be based on the filtered initial value.

Additional system embodiments may include: a single turn winding on both the first core and the second core; and a test circuit coupled to the single turn winding. Additional system embodiments may include: an H-bridge circuit electrically coupled to the first winding and the second winding. In additional system embodiments, the first comparator and the second comparator have a voltage threshold of 0.3V. In additional system embodiments, the calculated initial value may be proportional to the leakage current.

A method embodiment may include: driving a first drive winding wound on a first core with a first input signal; driving a second drive winding wound on a second core with a second input signal, where the second input signal has an opposite polarity of the first input signal; receiving a first drive signal from the first drive winding at a first comparator; outputting a signal based on the saturation of the first core from the first comparator; receiving a second drive signal from the second drive winding at a second comparator; outputting a signal based on the saturation of the second core from the second comparator; receiving, at a processor, output signals from the first comparator and the second comparator; determining, at the processor, a saturation status of the first core and the second core; and determining, at the processor, a potential leakage signal based said saturation status of the first core and the second core.

In additional method embodiments, determining the potential leakage signal based said saturation status of the first core and the second core further comprises: flipping, by the processor, a polarity of the first input signal and the second input signal to a first polarity if both the first core and the second core may be determined to be saturated based on the determined saturation status of the first core and the second core. In additional method embodiments, determining the potential leakage signal based said saturation status of the first core and the second core further comprises: recording a first rising edge time and a first period for the first signal input and for the second signal input.

In additional method embodiments, determining the potential leakage signal based said saturation status of the first core and the second core further comprises: flipping the polarity of the first input signal and the second input to a second polarity. In additional method embodiments, determining the potential leakage signal based said saturation status of the first core and the second core further comprises: recording a second rising edge time and a second period for the first signal input and the second signal input. In additional method embodiments, determining the potential leakage signal based said saturation status of the first core and the second core further comprises: calculating an initial value based on the differences in first rising edge times and second rising edge times between the first signal input and the second signal input, and the sum of the first and second periods of the first signal input and the second signal input, where the determined potential leakage signal may be based on the calculated initial value.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which:

FIG. 4A depicts a graph of voltage waveforms from a 10% mismatched pair of saturated cores with a positive leakage current present, according to an embodiment of the disclosure;

FIG. 4B depicts a graph of voltage waveforms from a 10% mismatched pair of saturated cores with negative leakage current present, according to an embodiment of the disclosure;

DETAILED DESCRIPTION

The present system allows for the detection of leakage currents using digital circuits. The present system may derive the leakage currents based on the time measurements made of the driven currents.

The techniques introduced below may be implemented by programmable circuitry programmed or configured by software and/or firmware, or entirely by special-purpose circuitry, or in a combination of such forms. Such special-purpose circuitry (if any) can be in the form of, for example, one or more application-specific integrated circuits (ASICs), programmable logic devices (PLDs), field-programmable gate arrays (FPGAs), etc.

FIGS. 1-15 and the following discussion provide a brief, general description of a suitable computing environment in which aspects of the described technology may be implemented. Although not required, aspects of the technology may be described herein in the general context of computer-executable instructions, such as routines executed by a general—or special—purpose data processing device (e.g., a server or client computer). Aspects of the technology described herein may be stored or distributed on tangible computer-readable media, including magnetically or optically readable computer discs, hard-wired or preprogrammed chips (e.g., EEPROM semiconductor chips), nanotechnology memory, biological memory, or other data storage media. Alternatively, computer-implemented instructions, data structures, screen displays, and other data related to the technology may be distributed over the Internet or over other networks (including wireless networks) on a propagated signal on a propagation medium (e.g., an electromagnetic wave, a sound wave, etc.) over a period of time. In some implementations, the data may be provided on any analog or digital network (e.g., packet-switched, circuit-switched, or other scheme).

The described technology may also be practiced in distributed computing environments where tasks or modules are performed by remote processing devices, which are linked through a communications network, such as a Local Area Network ("LAN"), Wide Area Network ("WAN"), or the Internet. In a distributed computing environment, program modules or subroutines may be located in both local and remote memory storage devices. Those skilled in the relevant art will recognize that portions of the described technology may reside on a server computer, while corresponding portions may reside on a client computer (e.g., PC, mobile computer, tablet, or smart phone). Data structures and transmission of data particular to aspects of the technology are also encompassed within the scope of the described technology.

Figure 1:
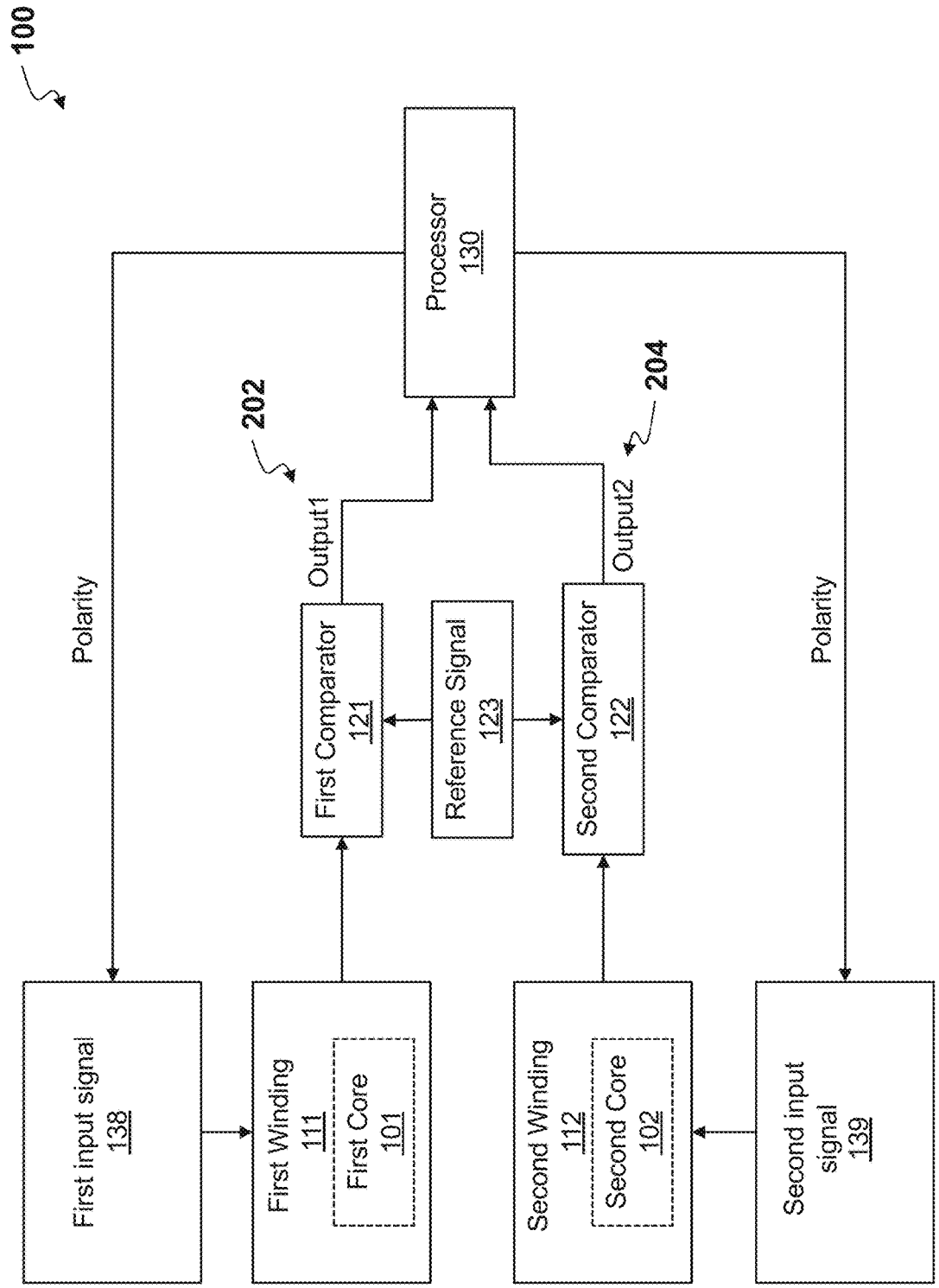
FIG. 1 shows a block diagram of the present system, according to an embodiment of the disclosure.

FIG. 1 shows a block diagram of the present system 100, according to an embodiment of the disclosure. The present system 100 includes a processor 130 that controls polarity. The present system 100 may include a first core 101 wound by a first winding 111 and a second core 102 wound by a second winding 112. The first core 101 and the second core 102 may be made of a highly "square" magnetic material such as permalloy, metglass, supermalloy, nanoperm, mu-metal, etc. The first winding 111 and the second winding 112 may be respectively driven by signals such as a first input signal 138 and a second input signal 139. The first input signal 138 and the second input signal 139 may be high-frequency square wave current and the first input signal 138 and the second input signal 139 may also have opposite polarities. In another embodiment the first winding 111 and the second winding 112 may be respectively driven by signals such as a first drive voltage source and a second drive voltage source (not shown) of opposite polarity to the first drive voltage source. The voltage signals may be high frequency voltage signals. The frequency range of the high frequency voltage signals may be dependent on the application. In some embodiments, the high frequency voltage signals may be about 5 kHz in embodiments where the highest frequency component to be measured is about 1 kHz in order to provide for adequate oversampling. In other embodiments, it may be desirable to have a higher or lower switching frequency. The cores 101, 102 are driven in opposite polarity to cancel out the signal imposed on the powerlines. The high frequency drive current may otherwise couple onto the powerlines through transformer action causing issues with EMC compliance. The first input signal 138 and the second input signal 139 may be high-frequency square wave voltage and the first input signal 138 and the second input signal 139 may have opposite polarities. The first input signal 138 may be a first drive current and/or voltage source and the second input signal 139 may be a second drive current and/or voltage source. In some embodiments, the drive currents may be supplied by an H-bridge circuit.

The present system 100 may further include a first comparator 121 receiving drive current from the first winding 111, a second comparator 122 receiving drive current from the second winding 112, and a processor 130 configured to receive a first comparator 121 output Output1 202 and a second comparator 122 output Output2 204. The processor 130 may be configured to determine if the first core 101 and the second core 102 have been saturated and a potential leakage current based on first comparator 121 output Output1 202 and second comparator 122 output Output2 204. In some embodiments, the processor 130 may be configured to have the first comparator 121 and the second comparator 122 built in. The processor 130 may determine if the first core 101 and the second core 102 are saturated, flip a polarity of the drive current to a first polarity if both the first core 101 and the second core 102 are determined to be saturated, record a first rising edge time and a first period for the first signal input and for the second signal input, flip the polarity of the drive current to a second polarity, and record a second rising edge time and a second period for the first signal input and the second signal input. In some embodiments, the processor 130 may be embodied by analog components.

Figure 2:
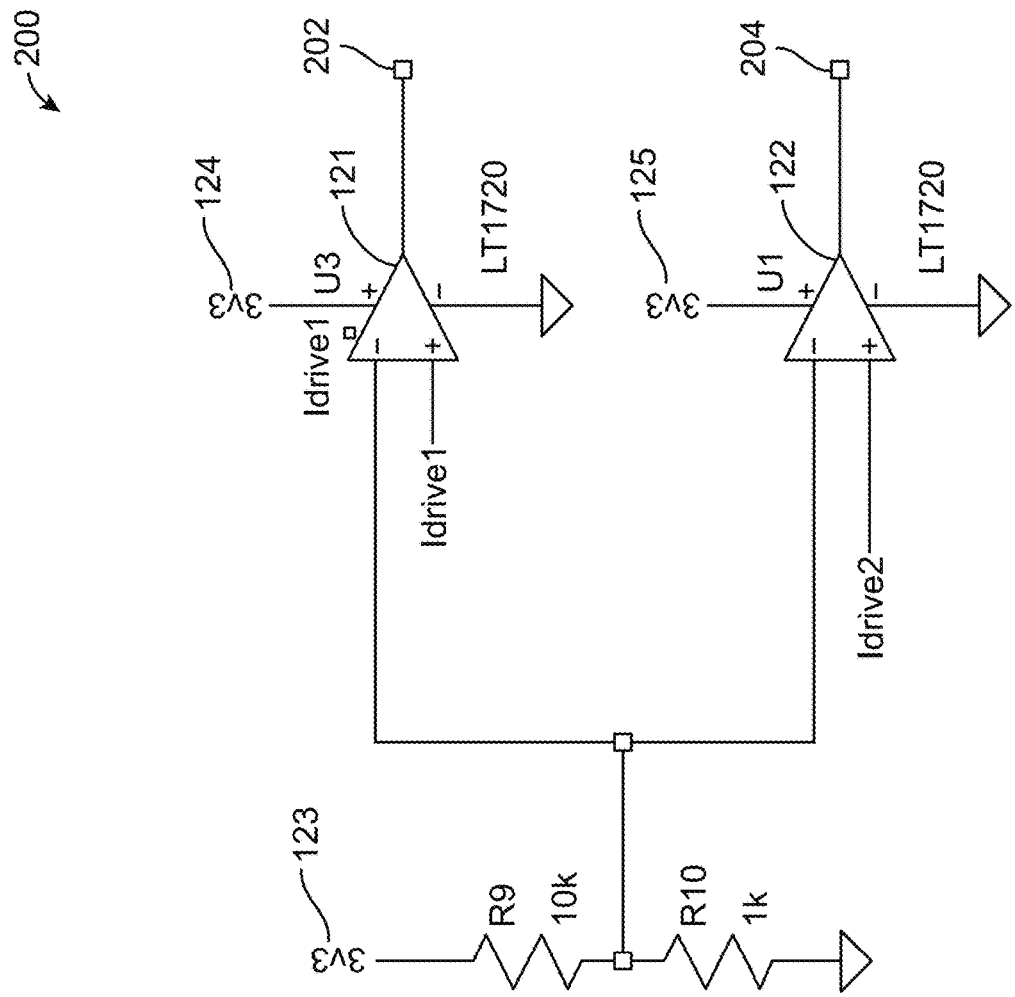
FIG. 2 depicts a circuit diagram of a first and second comparator configured to determine if a voltage threshold is met, according to an embodiment of the disclosure.

FIG. 2 depicts a circuit diagram of the first comparator 121 and the second comparator 122, where comparators 121 and 122 are configured to determine if a predetermined voltage threshold is met, according to an embodiment of the disclosure. As shown FIG. 2, the present system 200 may include a reference signal 123. In some embodiments, the reference signal 123 may be a reference voltage. In other embodiments, the reference signal 123 may be a reference voltage. The reference signal 123 may be used as a reference for a first voltage threshold of the first comparator 121 and a second voltage threshold of the second comparator 122 to determine if the first core (101, FIG. 1) and the second core (102, FIG. 1) have been saturated. In some embodiments, the reference signal 123 may be, for example 0.3V. In some embodiments, the reference signal 123 may be a saturation threshold. In some embodiments, the reference signal 123 may be a reference current. If voltage thresholds 124, 125 have been met, the corresponding comparators 121, 122 may send output signals respectively via outputs 202, 204 to the processor to indicate that the first core 101 and second core 102 have been saturated. If voltage thresholds 124, 125 have not been met, the corresponding comparators 121, 122 may send a different output signal via outputs 202, 204 to the processor to indicate that the first core 101 and second core 102 have not been saturated. First output 202 may be received as a first voltage input (1301, FIG. 3A). Second output 204 may be received as a second voltage input (1302, FIG. 3A). The comparators 121, 122 signal if the drive current thresholds have been met (e.g., HIGH=yes, LOW=no). The comparators do not amplify the drive currents.

While voltage is described throughout, in some embodiments current may be utilized. A first signal and a second signal may be a first voltage and a second voltage and/or a first current and a second current.

Figure 3A:
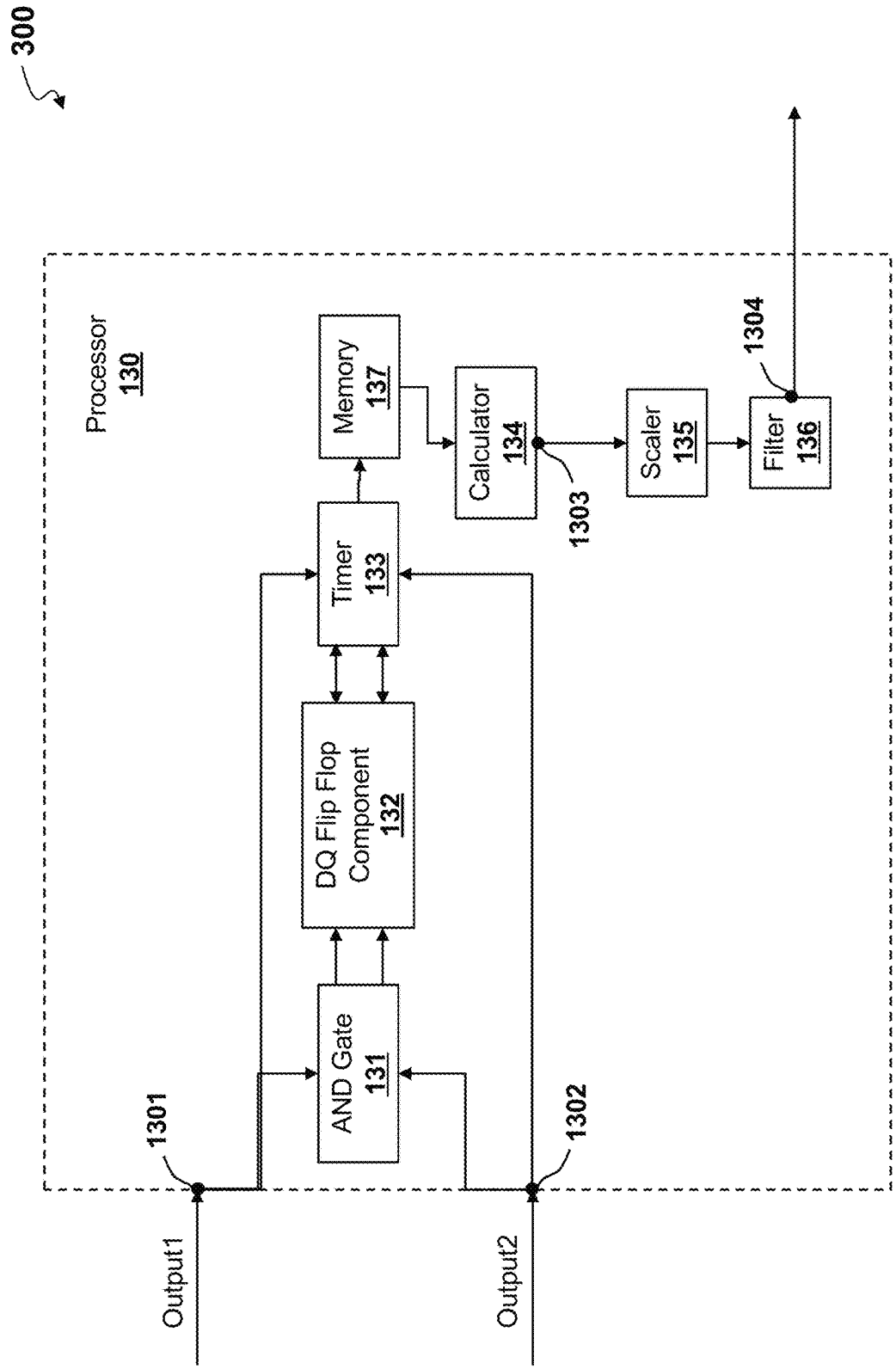
FIG. 3A shows a block diagram of the present system recording time measurements of the voltage inputs, according to an embodiment of the disclosure.

FIG. 3A shows a block diagram of the present system recording time measurements of the voltage inputs of a system 300, according to an embodiment of the disclosure. As shown in FIG. 3A, the processor 130 may be configured to receive the first comparator 121 output Output1 (202, FIG. 2) as a first voltage input 1301, and a second comparator 122 output Output2 (204, FIG. 2) as a second voltage input 1302. The processor 130 may be configured to execute an AND gate function 131 to determine if both the first core (101, FIG. 1) and the second core (102, FIG. 1) are saturated. The AND gate function 131 may determine if both cores (101, 102) are saturated by determining if both the first voltage input 1301 and the second voltage input 1302 are HIGH comparator outputs. If the AND gate function 131 determines that both voltage inputs 1301, 1302 are HIGH comparator outputs, then the processor 130 may execute a DQ flip flop component 132 function. In some embodiments, the processor 130 may be configured to execute an additional AND function prior to AND gate 131 for the first voltage input 1301 and another additional AND function for the second voltage input 1302. Continuing with this embodiment, the additional AND gates may increase the quality of the voltage inputs 1301, 1302 before being received by the original AND gate 131.

The DQ flip flop component 132 may initially flip the polarity of the voltage drive currents to a first polarity. In some embodiments, the first polarity (410, FIG. 4A) may be a positive polarity represented by the integer value +1. After the DQ flip flop components have flipped the polarity of the voltage drive currents (originating from first and second input signals 138 and 139, FIG. 1) to a first polarity, the processor may execute a timer 133 configured to record the rising edge times and the period of the voltage inputs 1301, 1302. After the timer has finished recording the rising edge times and period of the voltage inputs 1301, 1302 while the polarity is flipped to a first polarity, the DQ flip flop component 132 may flip the polarity to a second polarity. The DQ flip flop component 132 sets the polarity of the voltage drive currents. In some embodiments, the second polarity may be a negative polarity represented by the integer value −1. The timer 133 may then record the rising edge times and periods of the voltage inputs 1301, 1302, while the polarity is flipped to a second polarity. The timer 133 measures the time it takes for each of the cores (101, 102, FIG. 1) to saturate. The timer 133 may measure the output of the DQ Flip Flop Component 132 and the core saturation from the voltage inputs 1201, 1302.

Figure 3B:
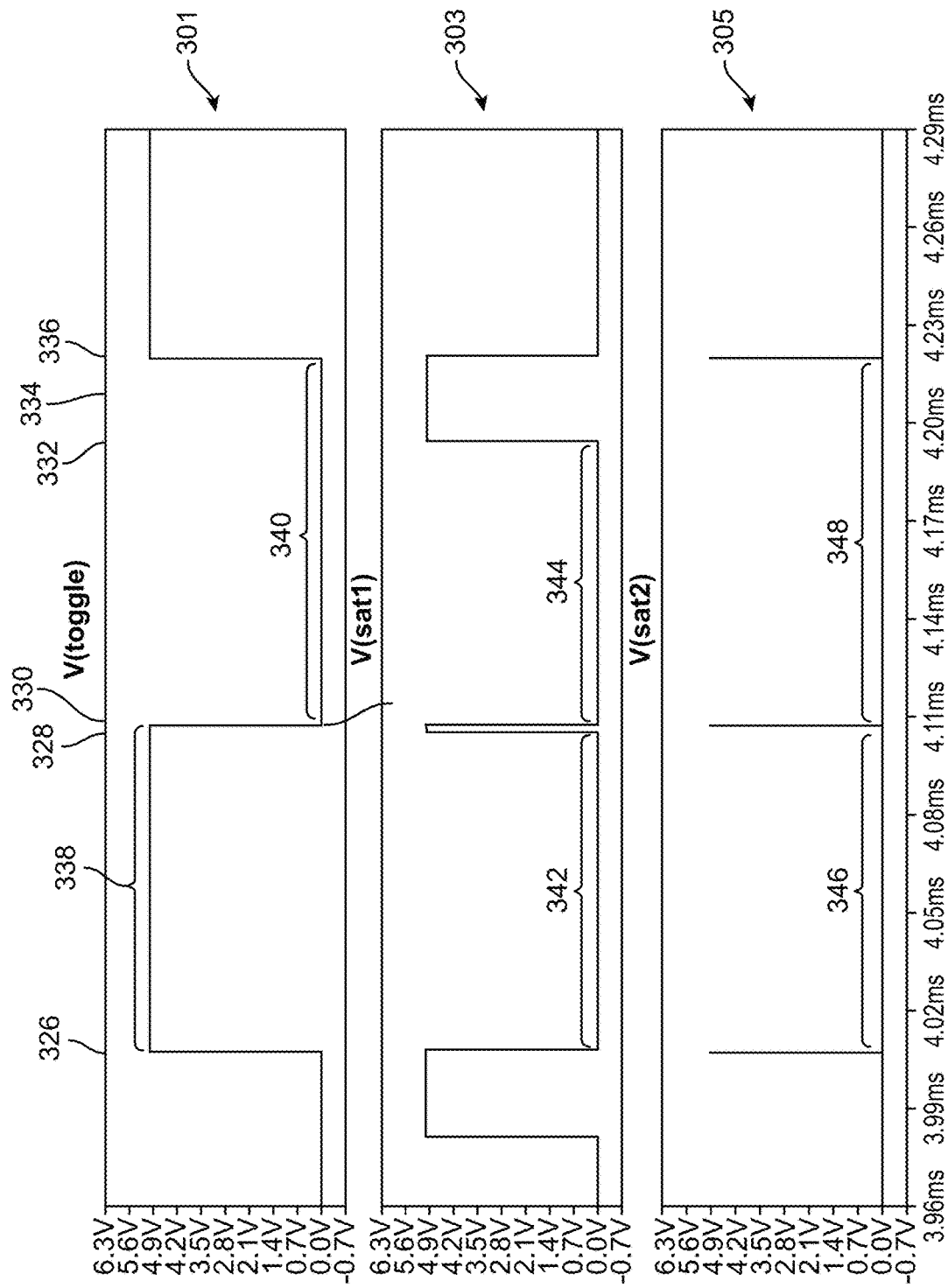
FIG. 3B depicts graphs showing recording time measurements of the voltage inputs, according to an embodiment of the disclosure.

FIG. 3B depicts graphs 301, 303, 305 showing recording time measurements of the voltage inputs (1301 and 1302, FIG. 3A). The top graph 301 shows V(toggle) over time, the middle graph 303 shows V(sat1) over time, and the bottom graph 305 shows V(sat2) over time. The top graph 301 shows the output voltage of the DQ Flip Flop Component (132, FIG. 3A). The middle graph 303 shows the voltage output (Output1 1301, FIG. 3A) from the first comparator (121, FIG. 1). The bottom graph 305 shows the voltage output (Output2 1302, FIG. 3A) from the second comparator (122, FIG. 1). The graphs include a first time 326, a second time 328, a third time 330, a fourth time 332, a fifth time 334, and a sixth time 336. The top graph for V(toggle) 301 includes a positive period 338 and a negative period 340. The middle graph for V(sat1) 303 includes a first positive width 342 and a first negative width 344. The bottom graph for V(Sat2) 305 includes a second positive width 346 and a second negative width 348.

Figure 3C:
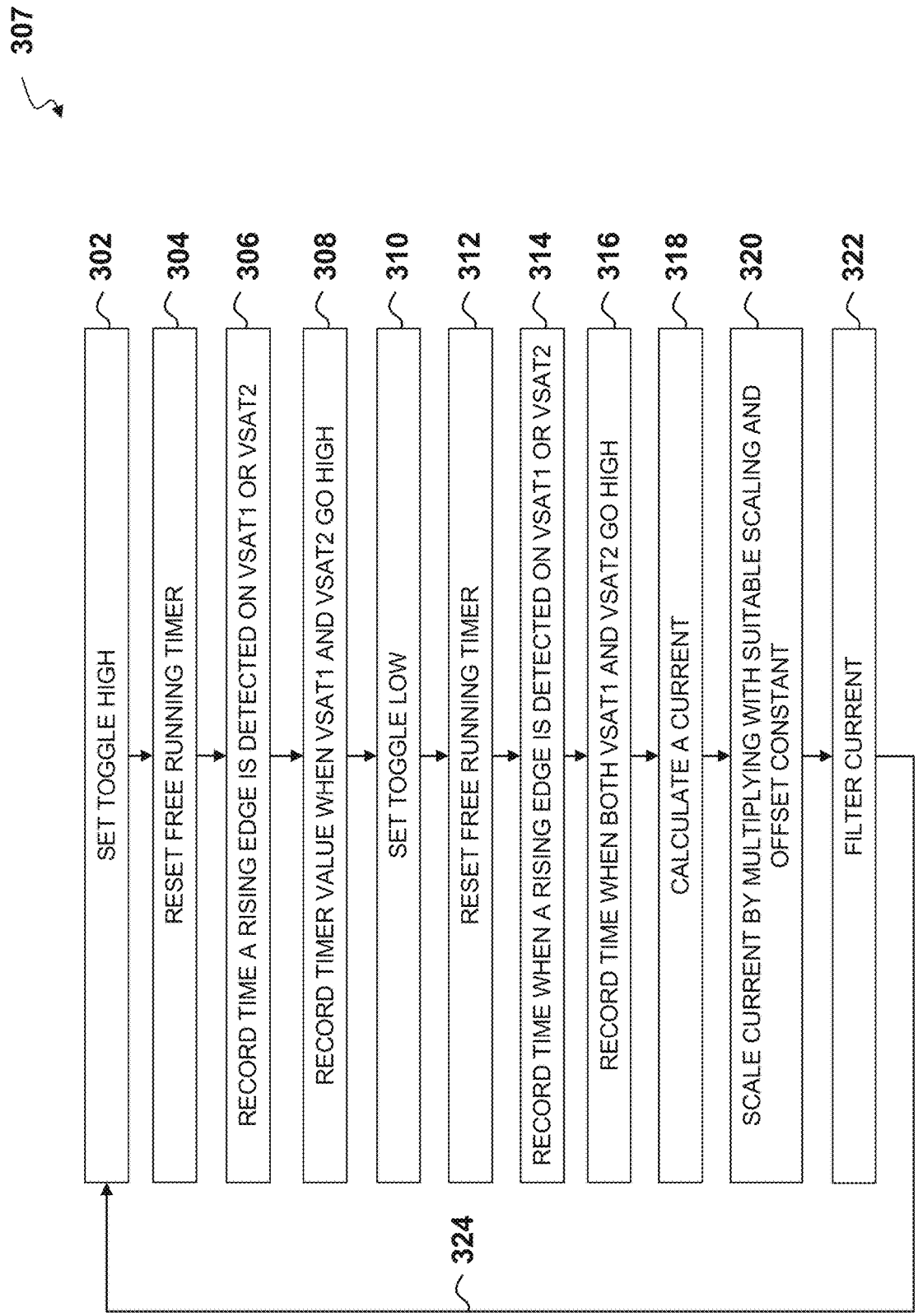
FIG. 3C depicts a method for recording time measurements of the voltage inputs, according to an embodiment of the disclosure.

FIG. 3C depicts a method for recording time measurements of the voltage inputs 307, according to one embodiment. At the first time (326, FIG. 3B), a toggle is set to HIGH (step 302) and a free running timer is reset (step 304). In some embodiments, the toggle may be set to HIGH (step 302) by the processor (130, FIG. 3A) as an output of the DQ Flip Flop Component (132, FIG. 3A). Resetting the free running timer (step 304) may be accomplished by the processor (130, FIG. 3A) zeroing out the timer (133, FIG. 3A) to start measuring the time by the timer (133, FIG. 3A).

At the second time (328, FIG. 3B), a rising edge is detected on Vsat1 303 or Vsat2 305 and the time is recorded in corresponding variable first positive width 342 or second position width 346 (step 306). Sat stands for saturation. In FIG. 3B, the rising edge is detected in Vsat1 303 and the time is recorded in the first positive width 342. These times may be recorded and stored by the timer (133, FIG. 3A)

At the third time (330, FIG. 3B), both Vsat1 303 and Vsat2 305 go HIGH and a timer value is recorded in the variable positive period 338 (step 308); the toggle is then set to LOW (step 310), and the free running timer is reset (step 312). In FIG. 3B, Vsat1 303 went HIGH and there is a period of time between the second time 328 and the third time 330 when Vsat2 305 also goes high. The recorded time values (step 308) may be recorded in an addressable memory (137, FIG. 3A) in communication with the timer (133, FIG. 3A). The toggle is set to low (step 310) by the DQ Flip Flop Component (132, FIG. 3A). The timer is reset (step 312) by the timer (133, FIG. 3A).

At the fourth time (332, FIG. 3B), a rising edge is detected on Vsat1 303 or Vsat2 305 and the time is recorded in the corresponding variable first negative width 344 or second negative width 348 (step 314). In FIG. 3B, Vsat1 303 went high before Vsat2.

At a fifth time (334, FIG. 3B), wait for both Vsat1 and Vsat2 to go high.

At a sixth time (336, FIG. 3B), a timer value is recorded in the variable negative period 340 when both Vsat1 303 and Vsat2 305 go HIGH (step 316), a current is then calculated (step 318), the calculated current is scaled by multiplying the current with a suitable scaling and offset constant determined experimentally (step 320), the current is filtered (step 322), and the process repeats (step 324). The current is calculated (step 318) by the calculator (134, FIG. 3A). The calculated current is scaled (step 320) by the scaler (135, FIG. 3A). The scaled current is filtered (step 322) by the filter (136, FIG. 3A). If the filtered current is a leakage value above a threshold value, then an action is taken such as charging being stopped, and the method 300 does not repeat (step 324).

The current may be calculated in step 318 as follows:

$$\text{current} = \frac{(\text{First Positive Width (342)} - \text{Second Positive Width (346)})}{\text{Positive Period (338)} - \text{Negative Period (340)}}$$

FIG. 4A depicts a graph of voltage waveforms from a 10% mismatched pair of saturated cores with a positive leakage current present. The timer may record a rising edge time 411 of the first voltage input, a rising edge time 412 of the second voltage input, a period P11 of the first voltage input, and a period P12 of the second voltage input. The polarity is shown by the V(toggle) waveform. The polarity is alternating as a positive leakage current is shown in FIG. 4A and a negative leakage current of 20 mA is shown in FIG. 4B

FIG. 4B depicts a graph of voltage waveforms from a 10% mismatched pair of saturated cores with negative leakage current present. The timer (133, FIG. 3A) may then record the rising edge time of the second voltage input 422, the rising edge time of the first voltage input 421, the period of second voltage input P22, and the period of the first voltage input P21.

Referring to FIG. 3A, After the timer 133 has recorded the times in a memory 137 while the polarity was flipped to a first polarity and to a second polarity, the processor 130 may execute to a calculator 134 to receive the recorded times. The calculator 134 may calculate and output an initial current value 1303 based on the rising edge times and periods recorded by the timer 133. The calculator 134 may determine the initial current value 1303 by first taking the difference between the rising edge times of the voltage inputs 1301, 1302 while the polarity was flipped to a first polarity, and the difference between the rising edge times of the voltage inputs 1301, 1302 while the polarity was flipped to a second polarity. The calculator 134 may then subtract the difference in rising edge times of the voltage inputs 1301, 1302 while the polarity was flipped to a second polarity from the difference in rising edge times of the voltage inputs 1301, 1302 while the polarity was flipped to a first polarity. In some embodiments, one input of voltage inputs 1301, 1302 may be inverted before adding the inputs 1301, 1302 together resulting in subtraction as an end result. The calculator 134 may then divide the subtracted result by the sum of the periods of the voltage inputs 1301, 1302 while the polarity was flipped to a first polarity and while the polarity was flipped to a second polarity. The calculations performed by the calculator 134 may be represented by the following equation:

$$\text{Initial value} = \frac{(FirstWidth0 - FirstWidth1) - (SecondWidth0 - SecondWidth1)}{FirstPeriod + SecondPeriod}$$

where FirstWidth0 is the rising edge time of the first voltage input 1301 while the polarity was flipped to a first polarity, FirstWidth1 is the rising edge time of the second voltage input 1302 while the polarity was flipped to a first polarity, SecondWidth0 is the rising edge time of the first voltage input 1301 while the polarity was flipped to a second polarity, SecondWidth1 is the rising edge time of the second voltage input 1302 while the polarity was flipped to a second polarity, the FirstPeriod is the period of the voltage inputs 1301,1302 while the polarity was flipped to a first polarity, and the SecondPeriod is the period of the voltage inputs 1301,1302 while the polarity was flipped to a second polarity. The calculator 134 may output a rough value proportional to leakage current.

In some embodiments, the periods for the first and second voltage inputs 1301, 1302 are not identical due to presence of leakage current extending one or the other, and cores not being perfectly identical.

Current in an inductor increases proportional to time when a constant voltage is applied. I=1/L* integral of V dt. As a constant voltage is applied, the measured time to saturation is proportional to current seen by the core, which includes drive current and leakage current. By changing the polarity of the drive current, the disclosed system can eliminate that from the equation through subtraction. The core time constant in Voltseconds may vary slightly from core to core so the reading may be normalized by dividing by the total measured period which is proportional to the timeconstant Therefore, the output is a percentage of the saturation current for the cores.

After the initial current has been calculated, the processor 130 may execute a scaler 135 to receive the initial value 1303 from the calculator 134. The scaler 135 may configure the initial current value 1303 based on predetermined values. The predetermined values may be multiplied with a calibration constant determined through testing. After the scaler 135 has configured the initial current value 1303, the scaler 135 may then output a leakage current output 1304. In some embodiments, the scaler 135 may compensate for temperature.

The timer 133, the calculator 134, and the scaler 135 together provide the present system 300 with an advantage over the prior art. The timer 133, the calculator 134, and the scaler 135 allow the present system 300 to determine the leakage current using digital circuits. By determining the leakage current using digital circuits, the present system 300 is less susceptible to external electromagnetic fields and is more reliable due to the reduced number of analog components.

In some embodiments, the leakage current output 1304 of the scaler 135 may be input to a filter 136. The filter 136 may filter this leakage current output 1304 of the scaler 135 to remove, for example noise. In other embodiments, the scaler 135 may comprise a filter. If the leakage current output 1304 exceeds a certain threshold, e.g., 17 mA, then charging may be stopped.

Figure 5:
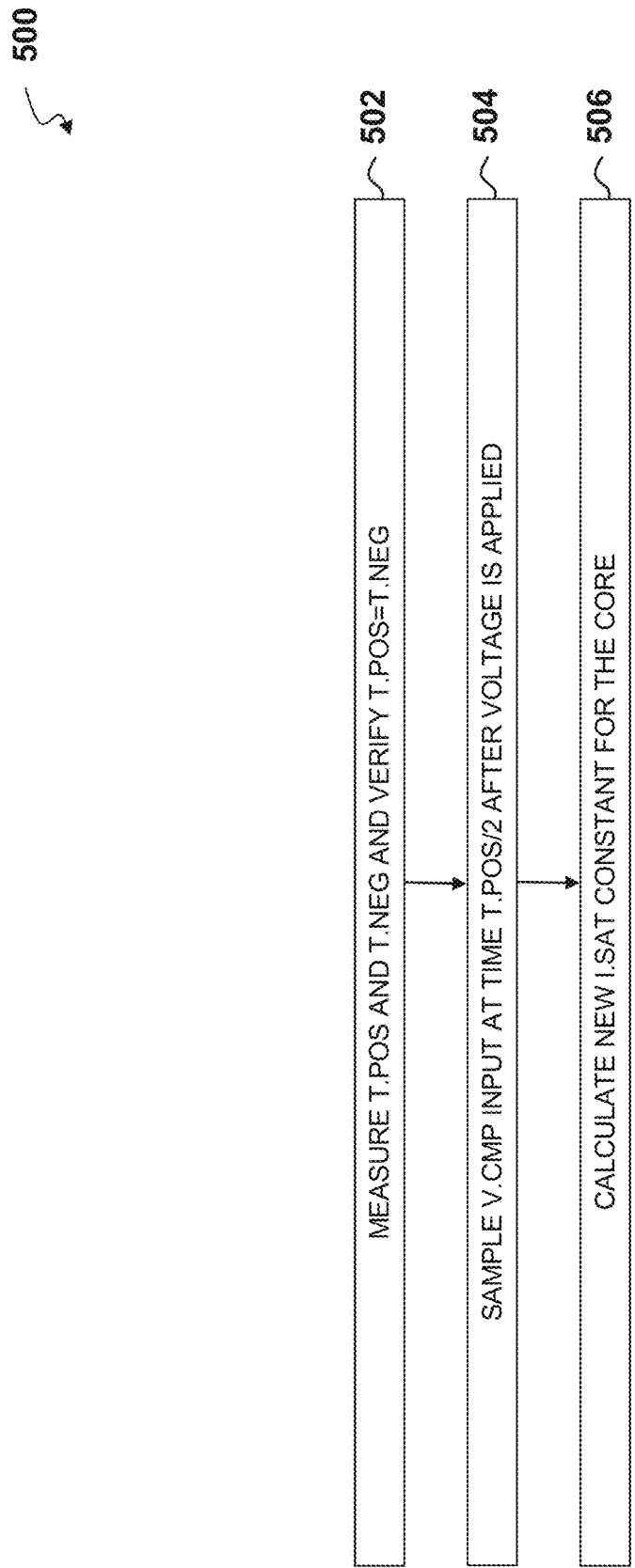
FIG. 5 depicts a method for calibrating a scaling constant from measured parameters for higher accuracy and reduced temperature sensitivity, according to an embodiment of the disclosure.

FIG. 5 depicts a method for calibrating a scaling constant from measured parameters for higher accuracy and reduced temperature sensitivity 500. For each core (101 and 102, FIG. 1), the method 500 may include measuring t.pos and t.neg and verifying that t.pos=t.neg (step 502). The method 500 may then include sampling V.cmp input at time t.pos/2 after voltage is applied (step 504). The method 500 may further comprise calculating a new I.sat constant for the core (step 506) using equation disclosed herein. FIG. 5 method may be accomplished by the processor (130, FIG. 3A) for each core to determine a saturation constant for each core (101, 102, FIG. 1)

As long as the saturation current of the two cores (101 and 102, FIG. 1) are the same the software method and the analytical approach are in agreement. When the saturation current of the two cores (101 and 102, FIG. 1) are not the same, the software calculation produces a proportional error. In real world situations, the exact value of the saturation current is not known and so the analytical equation would produce the same error. Therefore, for practical purposes they are the same.

If the saturation current of the cores (101 and 102, FIG. 1) can be measured the analytical equation would produce better results. Since I.sat is temperature dependent this could fix that issue.

The current through the drive windings (111 and 112, FIG. 1) is a function of inductance. By measuring the voltage across R. Sense a fixed time after the polarity of the H-bridge is flipped the inductance can be calculated.

The time to saturation is a function of inductance and saturation current of the core. Knowing the inductance allows for the calculation of what the saturation current is. Variations in core properties can then be compensated for.

$$I_{drive} = \frac{V_{src}}{R_{src}} \cdot \left(1 - e^{\frac{-R_{scr} \cdot t_{smpl}}{L_{drv}}}\right) \text{ solve, } L_{drv} \rightarrow -\frac{R_{src} \cdot t_{smpl}}{\ln\left(1 - \frac{I_{drive} \cdot R_{src}}{V_{src}}\right)}$$

I.sat (saturation current) may be determined using the following equation.

$$I_{sat\_meas} = \frac{V_{src}}{R_{src}} \cdot \left(1 - e^{\frac{-R_{scr} \cdot t_{pos}}{L_{drv}}}\right) \cdot N_d + I_{leakage}$$

Calibration may be done when t.pos=t.neg and there is no leakage current so this term can be eliminated.

$$I_{sat\_meas} = \frac{V_{src}}{R_{src}} \cdot \left[1 - e^{\left(\frac{-R_{scr} \cdot t_{pos}}{\ln\left(\frac{I_{drive} \cdot R_{src}}{V_{src}}\right)}\right)}\right] \cdot N_d \rightarrow I_{sat\_meas} =$$

-continued $$-\frac{20 \cdot V_{src} \cdot \left( e^{\frac{t_{pos} \cdot ln\left(1 - \frac{I_{drive} \cdot R_{src}}{V_{src}}\right)}{t_{smpl}}} - 1 \right)}{R_{src}}$$

The expression can be further simplified through Taylor expansion to:

$$I_{sat\_meas} = -N_{dr} \cdot \frac{V_{src}}{R_{src}} \cdot \left[ \left(1 - \frac{I_{drive} \cdot R_{src}}{V_{src}}\right)^{\frac{t_{pos}}{t_{smpl}}} - 1 \right]$$

I.drive can then be sampled at half the measured t.pos. Then, the exponent becomes 2 and it can be calculated. I.drive is the voltage at the comparator input (V.cmp) divided by R.sense.

$$I_{sat\_meas} = -N_{dr} \cdot \frac{V_{src}}{R_{src}} \cdot \left[ \left( \frac{\frac{V_{cmp}}{R_{sns}} \cdot R_{src}}{V_{src}} \right)^2 - 1 \right]$$

Figure 6:
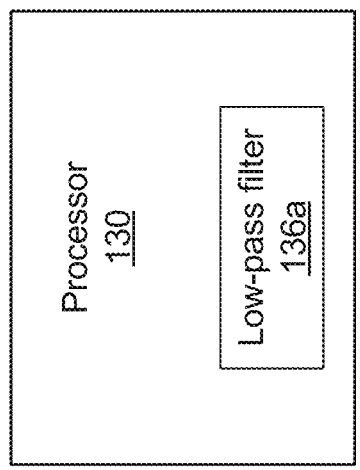
FIG. 6 shows a block diagram of a processor configured to execute a low-pass filter, according to an embodiment of the disclosure.

FIG. 6 shows a block diagram of a processor 130 configured to execute a low-pass filter 136a, according to an embodiment of the disclosure. The low-pass filter 136a may reduce the sensitivity of the measurement to noise at high frequencies. The low-pass filter 136a may remove the high frequency components to be less sensitive to high frequencies based on certain system requirements.

Figure 7:
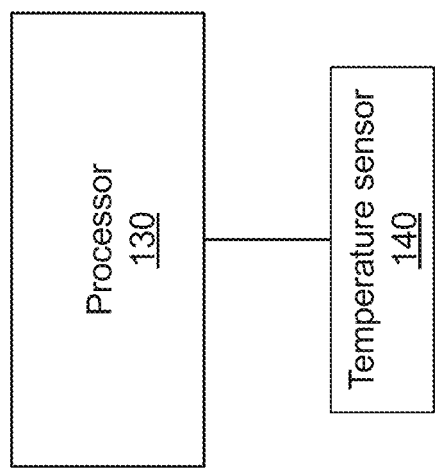
FIG. 7 shows a block diagram of the present system having a temperature sensor, according to an embodiment of the disclosure.

FIG. 7 shows a block diagram of a processor 130 configured to receive data from a temperature sensor 140, according to an embodiment of the disclosure. The processor 130 may use measurements from the temperature sensor 140 to increase temperature tolerance. The core parameters may change with the temperature of each core (101 and 102, FIG. 1). The scaling constants may be changed by the processor 130 as the temperature of the cores (101 and 102, FIG. 1) is increased.

Figure 8:
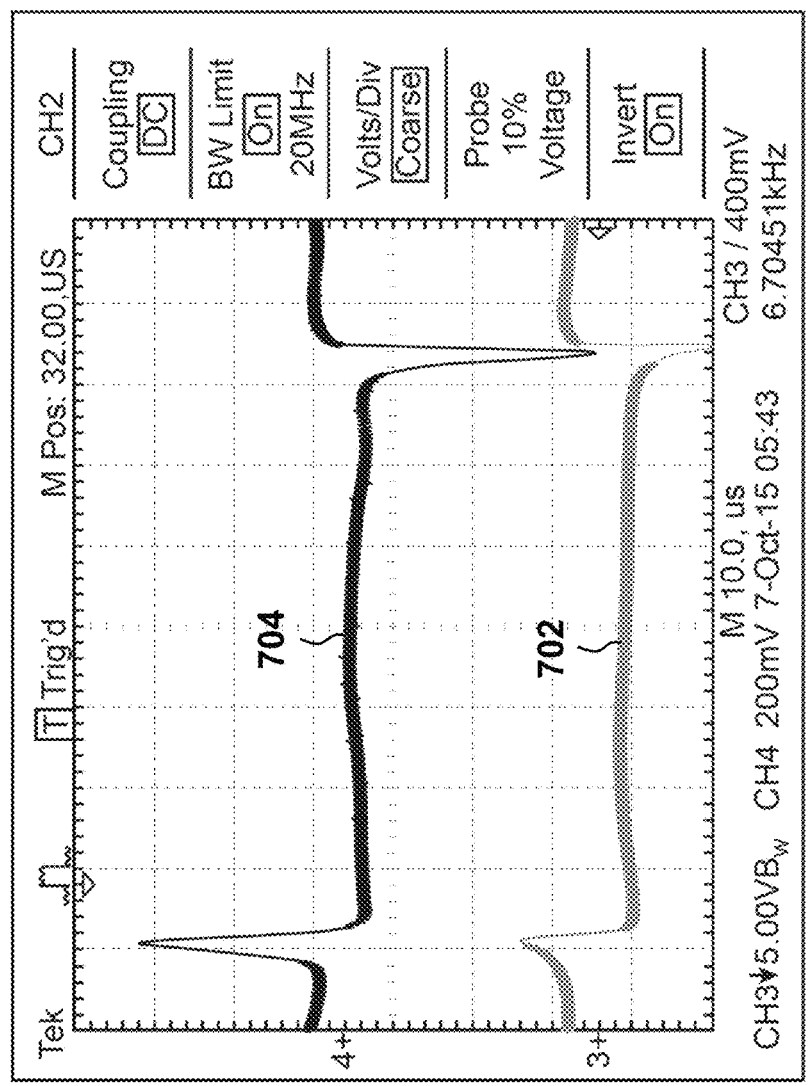
FIG. 8 depicts a graph of drive current and voltage on a sense winding for two poorly matched cores of a transformer driven in unison.

FIG. 8 depicts a graph 700 of drive current 702 and voltage 704 on a sense winding for two poorly matched cores of a transformer driven in unison. Mismatched cores (101 and 102, FIG. 1), temperature drift and external magnetic fields may cause pulses of alternating polarity on the sense winding when the two cores of the transformer saturate.

Figure 9:
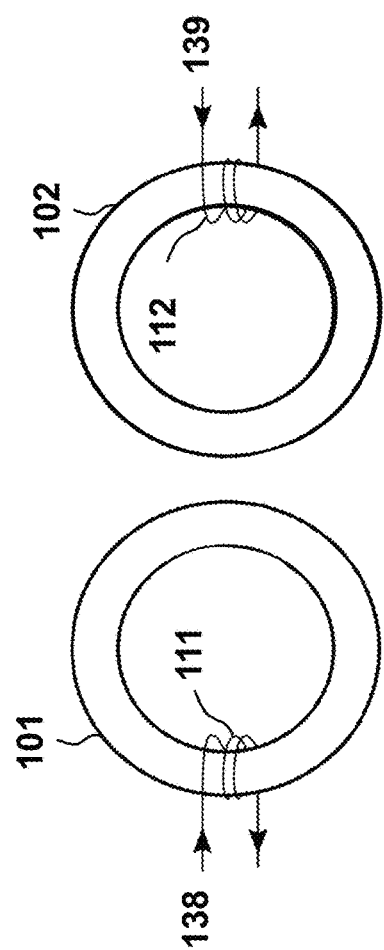
FIG. 9 depicts an exemplary circuit that can be coupled to the first and second cores, according to an embodiment of the disclosure.

FIG. 9 depicts an exemplary circuit that may be coupled to the first core 101 and the second core 102, according to an embodiment of the disclosure. The present system 900 may include a first core 101 wound by a first winding 111, a second core 102 wound by a seconding winding 112. The first winding 111 may be driven by a first input signal 138. The second winding 112 may be driven by a second input signal 139. A utility line (not shown) may go through a center of both cores 101, 102 for detection of leakage current in the utility line. The disclosed system and method allow for a greater mismatch between the cores 101, 102 as compared to other residual current detectors which require closely matched cores.

Figure 10:
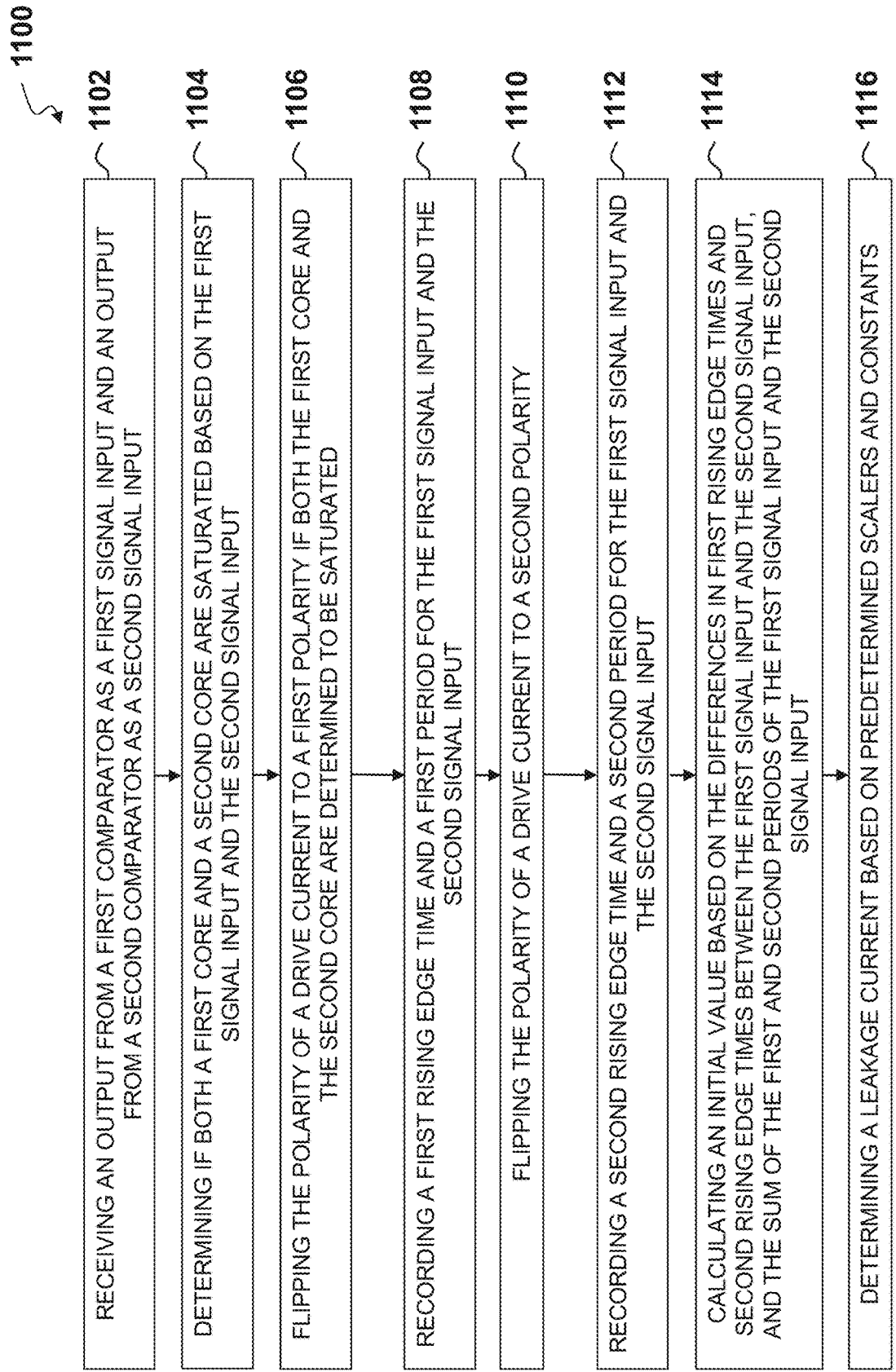
FIG. 10 depicts a method for calculating leakage currents based on timing information of the voltage waveforms, according to an embodiment of the disclosure.

FIG. 10 depicts a method 1100 for calculating leakage currents based on timing information of the signal waveforms, according to an embodiment of the disclosure. The method 1100 may have an initial step 1102 for receiving an output from a first comparator as a first signal input and an output from a second comparator as a second signal input. The first signal input may be a first voltage input and/or a first current input. The second signal input may be a second voltage input and/or a second current input. The method 1100 may then have a step 1104 for determining if both a first core and a second core are saturated based on the first signal input and the second signal input. The AND gate (131, FIG. 3A) may determine if the cores are saturated. The method 1100 may then have a step 1106 for flipping the polarity of drive current to a first polarity if both the first core and the second core are determined to be saturated. The DQ flip flop component (132, FIG. 3A) may switch polarity. The method 1100 may then have a step 1108 for recording a first rising edge time and a first period for the first signal input and the second signal input. The recorded first rising edge time and first period may be recorded by the timer (133, FIG. 3A) and stored in a memory (137, FIG. 3A). The method 1100 may then have a step 1110 for flipping the polarity of the drive current to a second polarity. The polarity may be flipped by the DQ flip flop component (132). The method 1100 may then have a step 1112 for recording a second rising edge time and a second period for the first signal input and the second signal input. The second rising edge time and the second period for the first signal input and the second signal input may be recorded by the timer (133, FIG. 3A) and stored in the memory (137, FIG. 3A). The method 1100 may then have a step 1114 for calculating an initial value based on the differences in first rising edge times and second rising edge times between the first signal input and the second signal input, and the sum of the first and second periods of the first signal input and the second signal input. This initial value may be calculated by the calculator (134, FIG. 3A). The method 1100 may then have a step 1116 for determining a leakage current based on predetermined scalers and constants. The initial value may be scaled by the scaler (135, FIG. 3A) and then filtered by the filter (136, FIG. 3A) to output a leakage current. Charging may be stopped if the determined leakage current exceeds a set threshold. Scalers and constants are scaling and filtering the calculate initial value.

Figure 11:
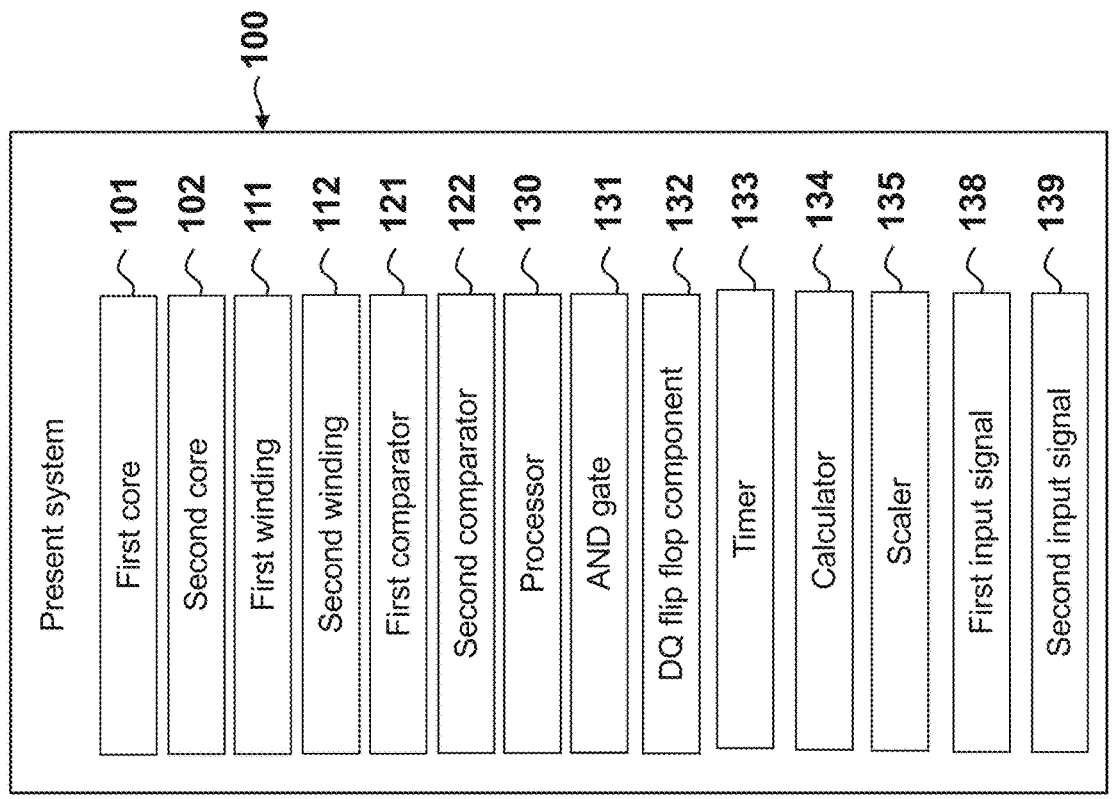
FIG. 11 is a high-level block diagram of the present system.

FIG. 11 depicts a high-level block diagram of the present system 100. The present system 100 may include a first core 101 wound by a first winding 111 and a second core wound by a second winding 112. Both the first winding 111 and the second winding 112 may be driven by a first input signal and a second input signal, respectively. The first input signal and the second input signal may be a high-frequency square wave current. The first input signal and the second input signal may be a high-frequency square wave voltage. The first winding 111 may direct a drive current to a first comparator 121 and the second winding may direct another drive current to a second comparator 122. The comparators 121, 122 compare the respective drive currents to a voltage threshold. If the voltage threshold is met, the comparators 121, 122 send an amplified output to the processor 130. The processor 130 may receive the comparator outputs as voltage inputs. The processor 130 may execute an AND gate 131 to determine if the output from both comparators 121, 122 are amplified. If both outputs are amplified, the processor may execute a DQ flip flop component 132 to flip the polarity of the voltage inputs and the timer 133 may record rising edge times and periods of the voltage inputs. The calculator 134 may determine an initial value based on the recorded measurements from the timer 133. The scaler 135 may then output a leakage current by configuring the initial value from the calculator 134 using predetermined scalers and constants.

Figure 12:
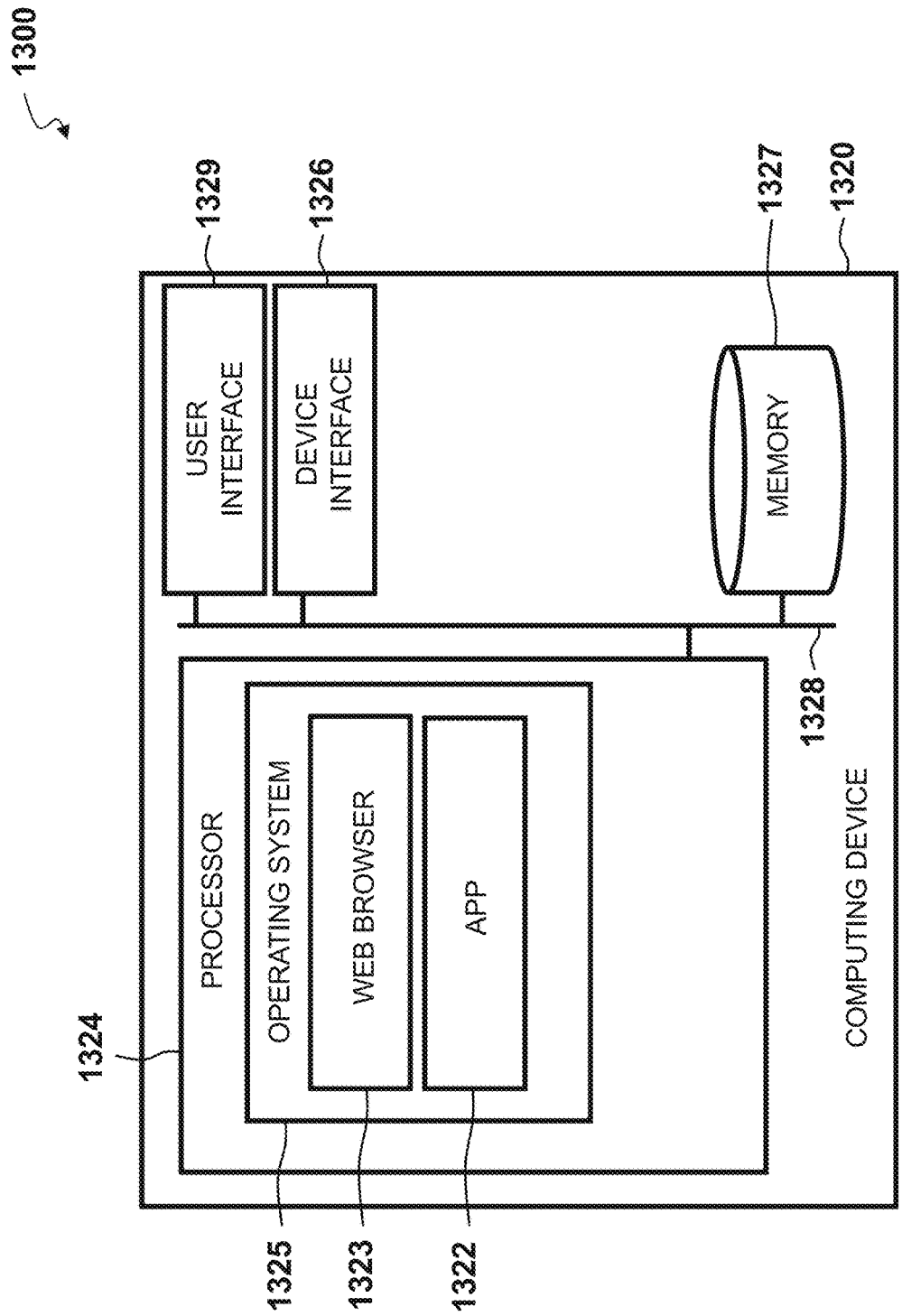
FIG. 12 depicts a top-level functional block diagram of a computing device system.

With respect to FIG. 12, an example of a top-level functional block diagram of a computing device system 1300 is illustrated. The system 1300 is shown as a computing device 1320 comprising a processor 1324, such as a central processing unit (CPU), addressable memory 1327, an external device interface 1326, e.g., an optional universal serial bus port and related processing, and/or an Ethernet port and related processing, and an optional user interface 1329, e.g., an array of status lights and one or more toggle switches, and/or a display, and/or a keyboard and/or a pointer-mouse system and/or a touch screen. Optionally, the addressable memory may include any type of computer-readable media that can store data accessible by the computing device 1320, such as magnetic hard and floppy disk drives, optical disk drives, magnetic cassettes, tape drives, flash memory cards, digital video disks (DVDs), Bernoulli cartridges, RAMs, ROMs, smart cards, etc. Indeed, any medium for storing or transmitting computer-readable instructions and data may be employed, including a connection port to or node on a network, such as a LAN, WAN, or the Internet. These elements may be in communication with one another via a data bus 1328.

Figure 13:
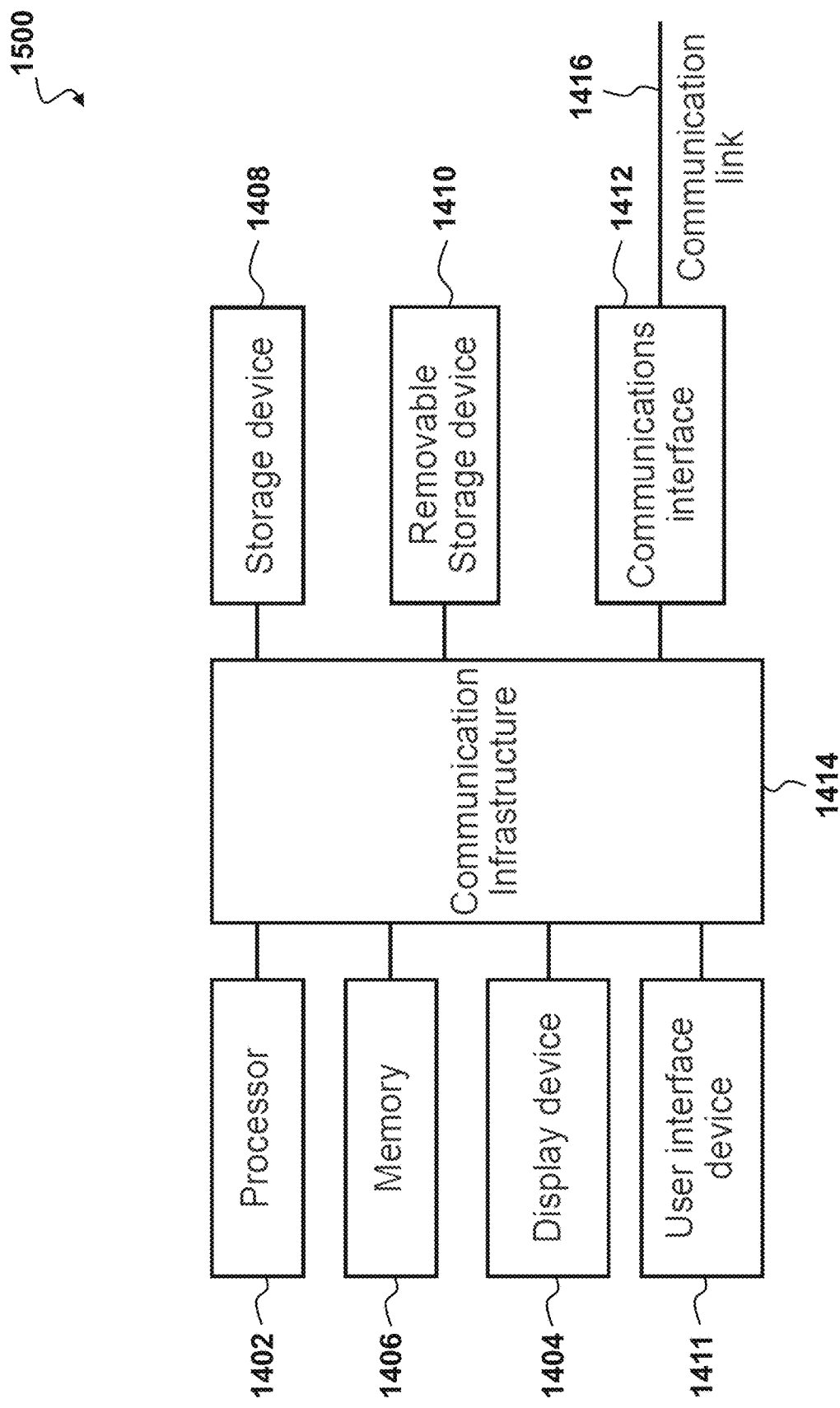
FIG. 13 shows a high-level block diagram and process of a computing system for implementing an embodiment of the system and process.

FIG. 13 is a high-level block diagram 1400 showing a computing system comprising a computer system useful for implementing an embodiment of the system and process, disclosed herein. Embodiments of the system may be implemented in different computing environments. The computer system includes one or more processors 1402, and can further include an electronic display device 1404 (e.g., for displaying graphics, text, and other data), a main memory 1406 (e.g., random access memory (RAM)), storage device 1408, a removable storage device 1410 (e.g., removable storage drive, a removable memory module, a magnetic tape drive, an optical disk drive, a computer readable medium having stored therein computer software and/or data), user interface device 1411 (e.g., keyboard, touch screen, keypad, pointing device), and a communication interface 1412 (e.g., modem, a network interface (such as an Ethernet card), a communications port, or a PCMCIA slot and card). The communication interface 1412 allows software and data to be transferred between the computer system and external devices. The system further includes a communications infrastructure 1414 (e.g., a communications bus, cross-over bar, or network) to which the aforementioned devices/modules are connected as shown.

Information transferred via communications interface 1414 may be in the form of signals such as electronic, electromagnetic, optical, or other signals capable of being received by communications interface 1414, via a communication link 1416 that carries signals and may be implemented using wire or cable, fiber optics, a phone line, a cellular/mobile phone link, a radio frequency (RF) link, and/or other communication channels. Computer program instructions representing the block diagram and/or flowcharts herein may be loaded onto a computer, programmable data processing apparatus, or processing devices to cause a series of operations performed thereon to produce a computer implemented process.

Embodiments have been described with reference to flowchart illustrations and/or block diagrams of methods, apparatus (systems) and computer program products according to embodiments. Each block of such illustrations/diagrams, or combinations thereof, can be implemented by computer program instructions. The computer program instructions when provided to a processor produce a machine, such that the instructions, which execute via the processor, create means for implementing the functions/operations specified in the flowchart and/or block diagram. Each block in the flowchart/block diagrams may represent a hardware and/or software module or logic, implementing embodiments. In alternative implementations, the functions noted in the blocks may occur out of the order noted in the figures, concurrently, etc.

Computer programs (i.e., computer control logic) are stored in main memory and/or secondary memory. Computer programs may also be received via a communications interface 1412. Such computer programs, when executed, enable the computer system to perform the features of the embodiments as discussed herein. In particular, the computer programs, when executed, enable the processor and/or multi-core processor to perform the features of the computer system. Such computer programs represent controllers of the computer system.

Figure 14:
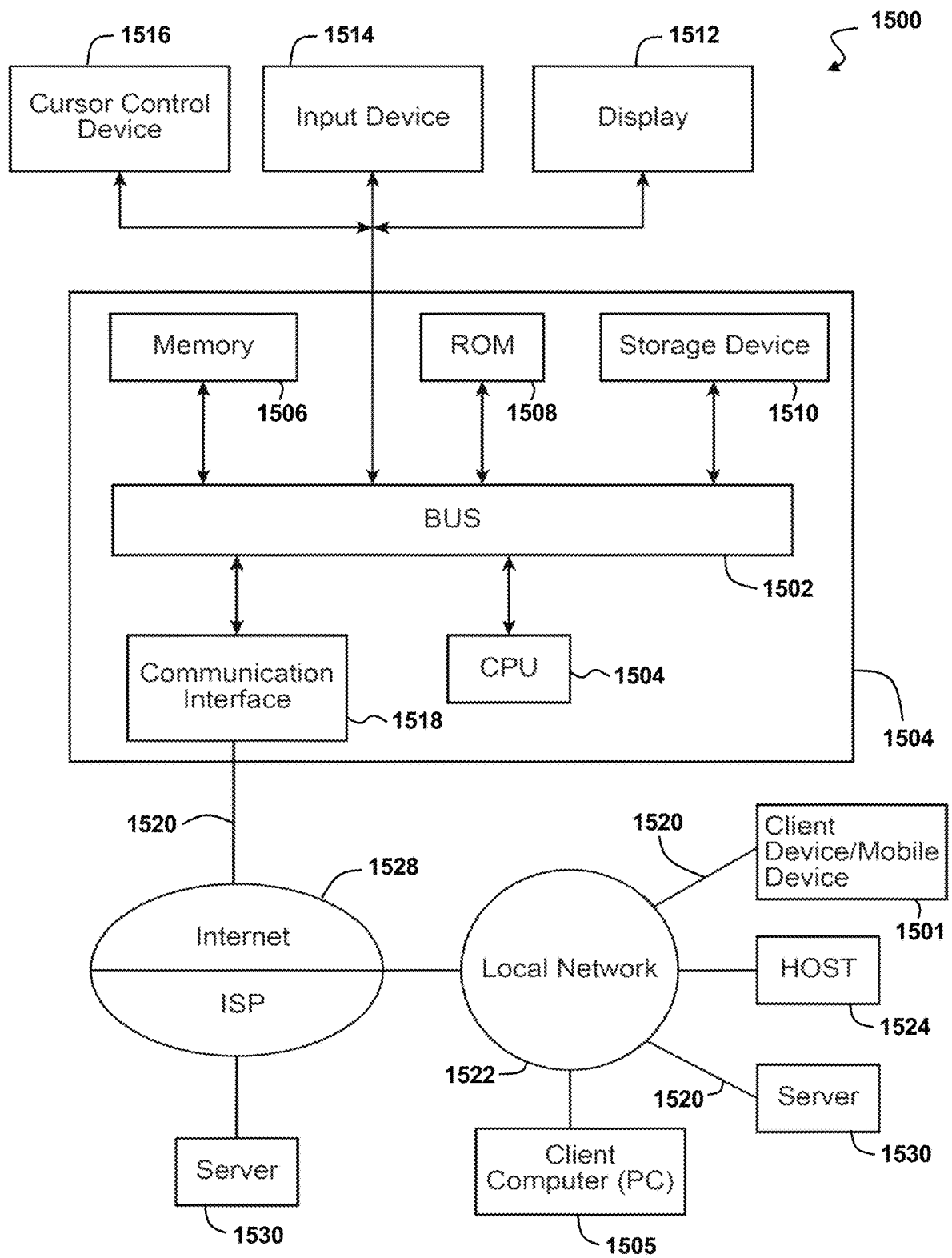
FIG. 14 shows a block diagram and process of an exemplary system in which an embodiment may be implemented.

FIG. 14 shows a block diagram of an example system 1500 in which an embodiment may be implemented. The system 1500 includes one or more client devices 1501 such as consumer electronics devices, connected to one or more server computing systems 1530. A server 1530 includes a bus 1502 or other communication mechanism for communicating information, and a processor (CPU) 1504 coupled with the bus 1502 for processing information. The server 1530 also includes a main memory 1506, such as a random access memory (RAM) or other dynamic storage device, coupled to the bus 1502 for storing information and instructions to be executed by the processor 1504. The main memory 1506 also may be used for storing temporary variables or other intermediate information during execution or instructions to be executed by the processor 1504. The server computer system 1530 further includes a read only memory (ROM) 1508 or other static storage device coupled to the bus 1502 for storing static information and instructions for the processor 1504. A storage device 1510, such as a magnetic disk or optical disk, is provided and coupled to the bus 1502 for storing information and instructions. The bus 1502 may contain, for example, thirty-two address lines for addressing video memory or main memory 1506. The bus 1502 can also include, for example, a 32-bit data bus for transferring data between and among the components, such as the CPU 1504, the main memory 1506, video memory and the storage 1510. Alternatively, multiplex data/address lines may be used instead of separate data and address lines.

The server 1530 may be coupled via the bus 1502 to a display 1512 for displaying information to a computer user. An input device 1514, including alphanumeric and other keys, is coupled to the bus 1502 for communicating information and command selections to the processor 1504. Another type or user input device comprises cursor control 1516, such as a mouse, a trackball, or cursor direction keys for communicating direction information and command selections to the processor 1504 and for controlling cursor movement on the display 1512.

According to one embodiment, the functions are performed by the processor 1504 executing one or more sequences of one or more instructions contained in the main memory 1506. Such instructions may be read into the main memory 1506 from another computer-readable medium, such as the storage device 1510. Execution of the sequences of instructions contained in the main memory 1506 causes the processor 1504 to perform the process steps described herein. One or more processors in a multi-processing arrangement may also be employed to execute the sequences of instructions contained in the main memory 1506. In alternative embodiments, hard-wired circuitry may be used in place of or in combination with software instructions to implement the embodiments. Thus, embodiments are not limited to any specific combination of hardware circuitry and software.

The terms "computer program medium," "computer usable medium," "computer readable medium", and "computer program product" are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information. Computer programs (also called computer control logic) are stored in main memory and/or secondary memory. Computer programs may also be received via a communications interface. Such computer programs, when executed, enable the computer system to perform the features of the embodiments as discussed herein. In particular, the computer programs, when executed, enable the processor multi-core processor to perform the features of the computer system. Accordingly, such computer programs represent controllers of the computer system.

Generally, the term "computer-readable medium" as used herein refers to any medium that participated in providing instructions to the processor 1504 for execution. Such a medium may take many forms, including but not limited to, non-volatile media, volatile media, and transmission media. Non-volatile media includes, for example, optical or magnetic disks, such as the storage device 1510. Volatile media includes dynamic memory, such as the main memory 1506. Transmission media includes coaxial cables, copper wire and fiber optics, including the wires that comprise the bus 1502. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, a carrier wave as described hereinafter, or any other medium from which a computer can read.

Various forms of computer readable media may be involved in carrying one or more sequences of one or more instructions to the processor 1504 for execution. For example, the instructions may initially be carried on a magnetic disk of a remote computer. The remote computer can load the instructions into its dynamic memory and send the instructions over a telephone line using a modem. A modem local to the server 1530 can receive the data on the telephone line and use an infrared transmitter to convert the data to an infrared signal. An infrared detector coupled to the bus 1502 can receive the data carried in the infrared signal and place the data on the bus 1502. The bus 1502 carries the data to the main memory 1506, from which the processor 1504 retrieves and executes the instructions. The instructions received from the main memory 1506 may optionally be stored on the storage device 1510 either before or after execution by the processor 1504.

The server 1530 also includes a communication interface 1518 coupled to the bus 1502. The communication interface 1518 provides a two-way data communication coupling to a network link 1520 that is connected to the world wide packet data communication network now commonly referred to as the Internet 1528. The Internet 1528 uses electrical, electromagnetic or optical signals that carry digital data streams. The signals through the various networks and the signals on the network link 1520 and through the communication interface 1518, which carry the digital data to and from the server 1530, are exemplary forms or carrier waves transporting the information.

In another embodiment of the server 1530, interface 1518 is connected to a network 1522 via a communication link 1520. For example, the communication interface 1518 may be an integrated services digital network (ISDN) card or a modem to provide a data communication connection to a corresponding type of telephone line, which can comprise part of the network link 1520. As another example, the communication interface 1518 may be a local area network (LAN) card to provide a data communication connection to a compatible LAN. Wireless links may also be implemented. In any such implementation, the communication interface 1518 sends and receives electrical electromagnetic or optical signals that carry digital data streams representing various types of information.

The network link 1520 typically provides data communication through one or more networks to other data devices. For example, the network link 1520 may provide a connection through the local network 1522 to a host computer 1524 or to data equipment operated by an Internet Service Provider (ISP). The ISP in turn provides data communication services through the Internet 1528. The local network 1522 and the Internet 1528 both use electrical, electromagnetic or optical signals that carry digital data streams. The signals through the various networks and the signals on the network link 1520 and through the communication interface 1518, which carry the digital data to and from the server 1530, are exemplary forms or carrier waves transporting the information.

The server 1530 can send/receive messages and data, including e-mail, program code, through the network, the network link 1520 and the communication interface 1518. Further, the communication interface 1518 can comprise a USB/Tuner and the network link 1520 may be an antenna or cable for connecting the server 1530 to a cable provider, satellite provider or other terrestrial transmission system for receiving messages, data and program code from another source.

The example versions of the embodiments described herein may be implemented as logical operations in a distributed processing system such as the system 1500 including the servers 1530. The logical operations of the embodiments may be implemented as a sequence of steps executing in the server 1530, and as interconnected machine modules within the system 1500. The implementation is a matter of choice and can depend on performance of the system 1500 implementing the embodiments. As such, the logical operations constituting said example versions of the embodiments are referred to for e.g., as operations, steps or modules.

Similar to a server 1530 described above, a client device 1501 can include a processor, memory, storage device, display, input device and communication interface (e.g., e-mail interface) for connecting the client device to the Internet 1528, the ISP, or LAN 1522, for communication with the servers 1530.

The system 1500 can further include computers (e.g., personal computers, computing nodes) 1505 operating in the same manner as client devices 1501, where a user can utilize one or more computers 1505 to manage data in the server 1530.

Figure 15:
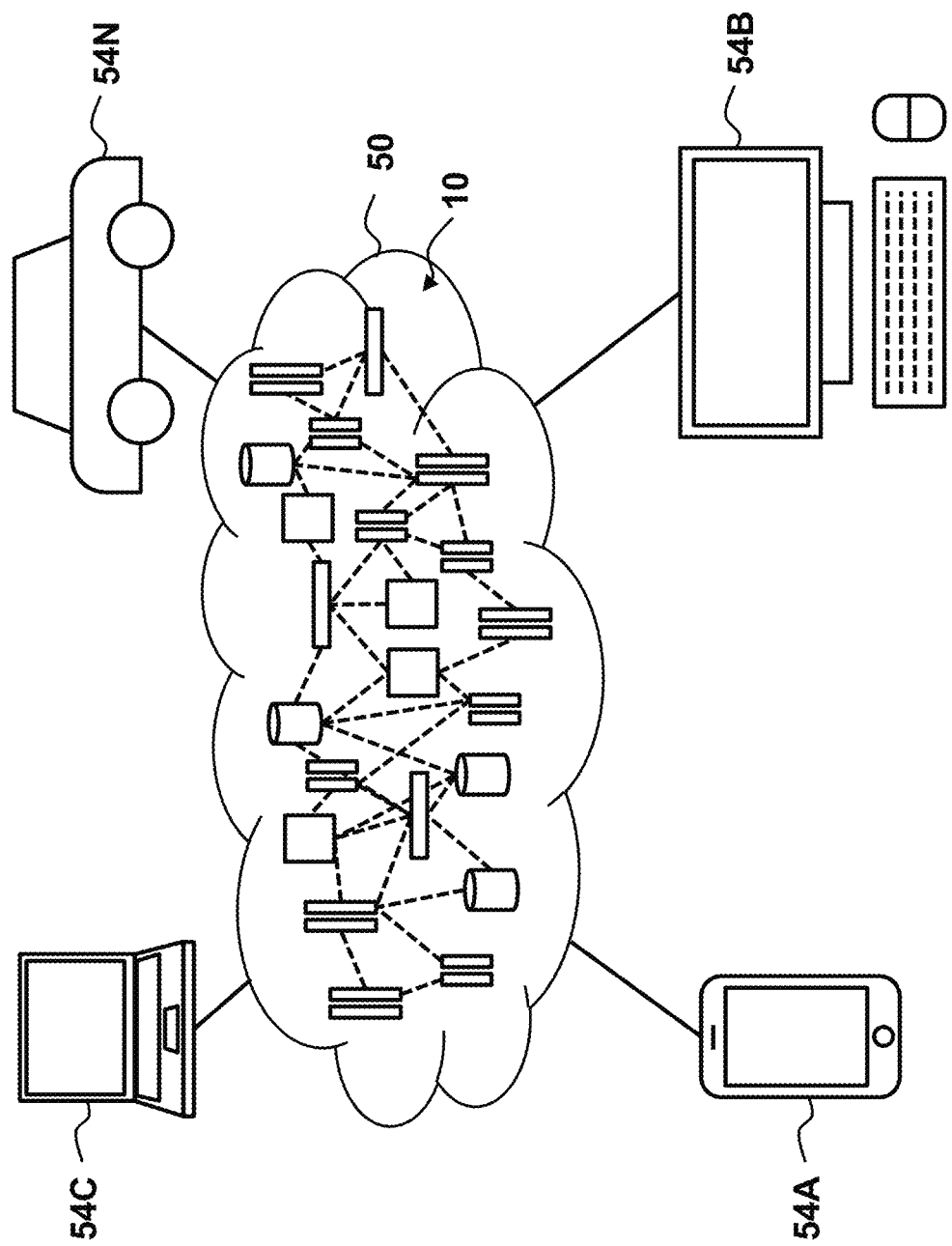
FIG. 15 depicts a cloud computing environment for implementing an embodiment of the system and process disclosed herein.

Referring now to FIG. 15, illustrative cloud computing environment 50 is depicted. As shown, cloud computing environment 50 comprises one or more cloud computing nodes 10 with which local computing devices used by cloud consumers, such as, for example, personal digital assistant (PDA), smartphone, smart watch, set-top box, video game system, tablet, mobile computing device, or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 15 are intended to be illustrative only and that computing nodes 10 and cloud computing environment 50 can communicate with any type of computerized device over any type of network and/or network addressable connection (e.g., using a web browser).

It is contemplated that various combinations and/or subcombinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention is herein disclosed by way of examples and should not be limited by the particular disclosed embodiments described above.

What is claimed is:

1. A system for charging an Electric Vehicle (EV) comprising:
   a first drive winding wound on a first core, wherein the first drive winding is driven with a first input signal;
   a second drive winding wound on a second core, wherein the second drive winding is driven with a second input signal, and wherein the second input signal has an opposite polarity of the first input signal;
   a first comparator configured to receive a first drive signal from the first drive winding, and output a signal based on the saturation of the first core;
   a second comparator configured to receive a second drive signal from the second drive winding, and output a signal based on the saturation of the second core; and
   a processor configured to receive the output signals from the first comparator and the second comparator, determine a saturation status of the first core and the second core, and determine a potential leakage signal based said saturation status of the first core and the second core, and stop charging the EV if a leakage current based on the determined potential leakage signal exceeds a set threshold.

2. The system of claim 1, wherein the first input signal is a high frequency voltage, and wherein the second input signal is a high frequency voltage.

3. The system of claim 1, wherein the first input signal is a high frequency current, and wherein the second input signal is a high frequency current.

4. The system of claim 1, wherein the first comparator is configured to receive a reference signal and compare the reference signal to the first drive signal and output the signal based on the comparison indicating the saturation of the first core, and wherein the second comparator is configured to receive the reference signal and compare the reference signal to the second drive signal and output the signal based on the comparison indicating the saturation of the second core.

5. The system of claim 1, wherein the processor is further configured to:
   flip a polarity of the first input signal and the second input signal to a first polarity if both the first core and the second core are determined to be saturated based on the determined saturation status of the first core and the second core.

6. The system of claim 5, wherein the processor is further configured to:
   record a first rising edge time and a first period for the first signal input and for the second signal input.

7. The system of claim 6, wherein the processor is further configured to:
   flip the polarity of the first input signal and the second input to a second polarity.

8. The system of claim 7, wherein the processor is further configured to:
   record a second rising edge time and a second period for the first signal input and the second signal input.

9. The system of claim 8, wherein the processor is further configured to:
   calculate an initial value based on the differences in first rising edge times and second rising edge times between the first signal input and the second signal input, and the sum of the first and second periods of the first signal input and the second signal input, wherein the determined potential leakage signal is based on the calculated initial value.

10. The system of claim 9, wherein the processor is further configured to:
    scale the calculated initial value; and
    filter the scaled initial value, wherein the determined potential leakage signal is based on the filtered initial value.

11. The system of claim 1, further comprising:
    a single turn winding on both the first core and the second core; and
    a test circuit coupled to the single turn winding.

12. The system of claim 1, further comprising:
    an H-bridge circuit electrically coupled to the first winding and the second winding.

13. The system of claim 1, wherein the first comparator and the second comparator have a voltage threshold of 0.3V.

14. The system of claim 9, wherein the calculated initial value is proportional to the leakage current.

15. A method for charging an Electric Vehicle (EV) comprising:
    driving a first drive winding wound on a first core with a first input signal;
    driving a second drive winding wound on a second core with a second input signal, wherein the second input signal has an opposite polarity of the first input signal;

receiving a first drive signal from the first drive winding at a first comparator;

outputting a signal based on the saturation of the first core from the first comparator;

receiving a second drive signal from the second drive winding at a second comparator;

outputting a signal based on the saturation of the second core from the second comparator;

receiving, at a processor, output signals from the first comparator and the second comparator;

determining, at the processor, a saturation status of the first core and the second core;

determining, at the processor, a potential leakage signal based said saturation status of the first core and the second core; and stopping, at the processor, charging the EV if a leakage current based on the determined potential leakage signal exceeds a set threshold.

16. The method of claim 15, wherein determining the potential leakage signal based said saturation status of the first core and the second core further comprises:

flipping, by the processor, a polarity of the first input signal and the second input signal to a first polarity if both the first core and the second core are determined to be saturated based on the determined saturation status of the first core and the second core.

17. The method of claim 16, wherein determining the potential leakage signal based said saturation status of the first core and the second core further comprises:

recording a first rising edge time and a first period for the first signal input and for the second signal input.

18. The method of claim 17, wherein determining the potential leakage signal based said saturation status of the first core and the second core further comprises:

flipping the polarity of the first input signal and the second input to a second polarity.

19. The method of claim 18, wherein determining the potential leakage signal based said saturation status of the first core and the second core further comprises:

recording a second rising edge time and a second period for the first signal input and the second signal input.

20. The method of claim 19, wherein determining the potential leakage signal based said saturation status of the first core and the second core further comprises:

calculating an initial value based on the differences in first rising edge times and second rising edge times between the first signal input and the second signal input, and the sum of the first and second periods of the first signal input and the second signal input, wherein the determined potential leakage signal is based on the calculated initial value.

* * * * *